US007081775B2

(12) United States Patent
Nilson et al.

(10) Patent No.: US 7,081,775 B2

(45) **Date of Patent: *Jul. 25, 2006**

(54) BIAS TECHNIQUE FOR OPERATING POINT CONTROL IN MULTISTAGE CIRCUITS

(75) Inventors: Christopher D. Nilson, San Jose, CA (US); Thomas B. Cho, Alameda, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/379,132

(22) Filed: Mar. 3, 2003

(65) Prior Publication Data

US 2003/0128056 A1 Jul. 10, 2003

Related U.S. Application Data

(62) Division of application No. 09/559,498, filed on Apr. 27, 2000, now Pat. No. 6,552,580.

(60) Provisional application No. 60/135,461, filed on May 24, 1999.

(51) Int. Cl.
*H03R 5/22* (2006.01)

(52) U.S. Cl. ......................... 327/65; 327/560; 327/563

(58) Field of Classification Search .................. 327/50, 327/52, 65, 66, 53, 530, 538, 543, 541, 560, 327/562, 563, 355, 359; 330/254, 261, 133, 330/311

See application file for complete search history.

(56) References Cited

U.S. PATENT DOCUMENTS

| | | | | |
|---|---|---|---|---|
| 4,874,966 A | | 10/1989 | Gehrt et al. | 327/538 |
| 5,418,494 A | | 5/1995 | Betti et al. | 330/254 |
| 5,451,898 A | * | 9/1995 | Johnson | 327/563 |
| 5,471,169 A | | 11/1995 | Dendinger | 327/66 |
| 5,532,637 A | | 7/1996 | Khoury et al. | 327/359 |
| 5,594,383 A | | 1/1997 | Tamba | 327/552 |
| 5,847,605 A | | 12/1998 | Mihailovits et al. | 330/252 |
| 5,909,127 A | | 6/1999 | Pearson et al. | 327/65 |
| 5,910,736 A | * | 6/1999 | Nagata et al. | 327/563 |

* cited by examiner

*Primary Examiner*—Long Nguyen

(74) *Attorney, Agent, or Firm*—Blakely, Sokoloff, Taylor & Zafman LLP

(57) ABSTRACT

A multistage analog circuit for independently controlling a bias current in each stage of the multistage analog circuit having an input stage, an intermediate stage, and an output stage, includes a first current source which controls the input stage of the circuit, a second current source which controls the intermediate stage of the circuit, and a third current source which controls the output stage of the circuit. The bias current in each stage of the circuit is set by the first, second, and third current sources. An output voltage of the circuit is capable of remaining the same when the first current source is changed to affect an input transconductance of the circuit.

3 Claims, 3 Drawing Sheets

BIAS TECHNIQUE FOR OPERATING POINT CONTROL IN MULTISTAGE CIRCUITS

RELATED APPLICATION

This application is a divisional of application Ser. No. 09/559,498, filed Apr. 27, 2000 now U.S. Pat. No. 6,552,580, which application(s) are incorporated herein by reference.

This application claims the benefit of Provisional Application, U.S. Ser. No. 60/135,461, filed on May 24, 1999, entitled "BIAS TECHNIQUE FOR OPERATING POINT CONTROL IN MULTISTAGE CIRCUITS", by Christopher D. Nilson and Thomas B. Cho.

BACKGROUND OF THE INVENTION

1. Field of the Invention

This invention relates in general to analog integrated circuits in telecommunication systems, and more particularly to a bias technique for operating point control in multistage analog integrated circuits.

2. Description of Related Art

Analog integrated circuits (IC), such as differential amplifiers, integrated mixers, and buffers, have been widely used in telecommunication systems. One of the desirable features is to operate the parameters of the circuit, such as an average output voltage level and an input stage transconductance, over widely varying process parameters, supply voltages, and temperatures.

In existing multistage analog ICs, bias conditions of all stages are generally set by one current source. This current source controls an input stage transconductance (GM). This current source also controls a quiescent output voltage, such as an output common mode voltage (VOCM) at the output stage of the circuit. Accordingly, any change in the current source for the purpose of affecting an input stage transconductance (GM), for example, increasing GM to improve the performance of the circuit, also affects an average output voltage level, such as an output common mode voltage (VOCM). This is an undesirable feature in many cases, especially since large changes in the current source are usually required to change an input stage transconductance (GM) due to a square root function between GM and I (GM=SQRT(I*Mu*Cox*W/L), where Mu is mobility, Cox is gate capacitance, and W/L is the geometry of a transistor, for example, M1 as described below in FIG. 2), whereas an output common mode voltage (VOCM) is determined by a linear function between VOCM and I (VOCM=VDD–(I*R)/2).

A typical analog integrated circuit (IC) is shown in FIG. 1 which has an input stage, an intermediate stage, and a load stage. An exemplary implementation having a cascoded differential amplifier with resistive loads is shown in FIG. 2. The term "cascoded" is different from the term "cascaded". The term "cascoded" is generally referred to as the arrangement of several components of a single device being connected to in a series of stages, one on top of another, for example an input stage, an intermediate stage, and an output stage, etc. The term "cascaded" is generally referred to as the arrangement of two or more devices being connected in series, one after another.

FIG. 2 illustrates an exemplary differential amplifier having an input stage, an intermediate stage, and an output stage. At the input stage, a differential input pair of transistors M1–M2 and current mirror transistors M3–M4 form an input stage transconductance. The cascodes, transistors

M5–M6, form a current buffer at an intermediate stage. Resistors R1–R2 form a load at an output stage.

As shown in FIG. 2, the bias conditions of all three stages are set by one current source I1, including an input stage transconductance GM (GM=SQRT(I1*Mu*Cox*W1/L1) and a quiescent output voltage VOCM (VOCM=VDD–(I1*R1)/2), wherein VDD is a voltage supply, Mu is the mobility, Cox is a gate capacitance, and W1/L1 is a geometry of a transistor M1. Any changes in I1 for the purpose of affecting the input stage transconductance GM also affect the quiescent output voltage VOCM. This is an undesirable feature in many cases, especially since large changes in I1 are required to change GM due to the square root function between GM and I1, thereby causing much larger changes in VOCM due to the linear function between VOCM and I1.

It is with respect to these and other considerations that the present invention has been made.

SUMMARY OF THE INVENTION

To overcome the limitations in the prior art described above, and to overcome other limitations that will become apparent upon reading and understanding the present specification, the present invention discloses a bias technique for operating point control in multistage analog circuits.

The present invention solves the above-described problems by providing a technique of independently controlling a bias current in each stage of a multistage analog circuit. This technique allows independent control of parameters, such as an average output voltage level and an input stage transconductance. Accordingly, any changes of a current source at an input stage for the purpose of affecting an input stage transconductance would not affect an average voltage level at an output stage.

In one embodiment of the present invention, a multistage analog circuit for independently controlling a bias current in each stage of the multistage analog circuit having an input stage, an intermediate stage, and an output stage, includes a first current source which controls the input stage of the circuit, a second current source which controls the intermediate stage of the circuit, and a third current source which controls the output stage of the circuit. The bias current in each stage of the circuit is set by the first, second, and third current sources, wherein an output voltage of the circuit is capable of remaining the same when the first current source is changed to affect a transconductance of the input stage.

Still in one embodiment, the bias current in the input stage is determined by the first current source.

Further in one embodiment, the bias current in the intermediate stage is determined by the first and second current sources.

Additionally in one embodiment, the bias current in the output stage is determined by the first, second, and third current sources.

Yet in one embodiment, the multistage analog circuit can be a differential amplifier, an integrated mixer, a buffer, or any other suitable multistage analog circuits.

In one embodiment of the present invention, a method of independently controlling a bias current in each stage of a multistage analog circuit having an input stage, an intermediate stage, and an output stage, includes the steps of providing a first current source which controls the input stage of the circuit, a second current source which controls the intermediate stage of the circuit, and a third current source which controls the output stage of the circuit; changing the first current source to change a transconductance of the input stage; and setting the second and third current sources such that an output voltage of the circuit remains the same.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which it is shown by way of illustration the specific embodiment in which the invention may be practiced. It is to be understood that other embodiments may be utilized as structural changes may be made without departing from the scope of the present invention.

The present invention provides a technique of independently controlling a bias current in each stage of a multistage analog circuit. This technique allows independent control of parameters, such as an average output voltage level and an input stage transconductance, etc. Accordingly, any changes of a current source at an input stage for the purpose of affecting the input stage transconductance would not affect the average output voltage level.

Figure 1:
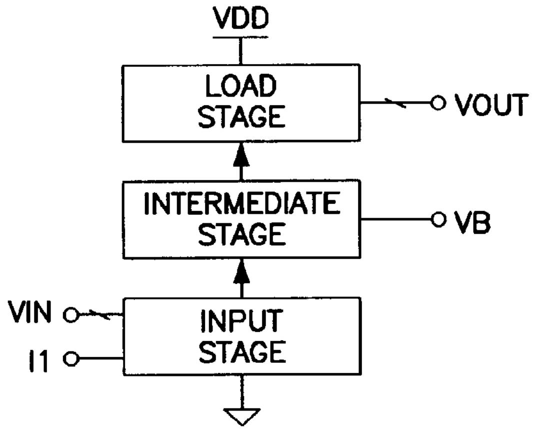
FIG. 1 PRIOR ART
FIG. 1 is a schematic diagram illustrating a typical multistage analog circuit.
Figure 2:
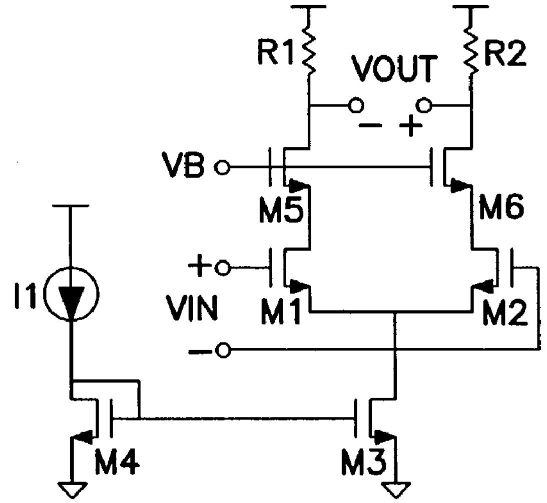
FIG. 2 (Prior Art)
FIG. 2 is a schematic diagram illustrating an exemplary implementation of the typical multistage analog circuit shown in FIG. 1.
Figure 3:
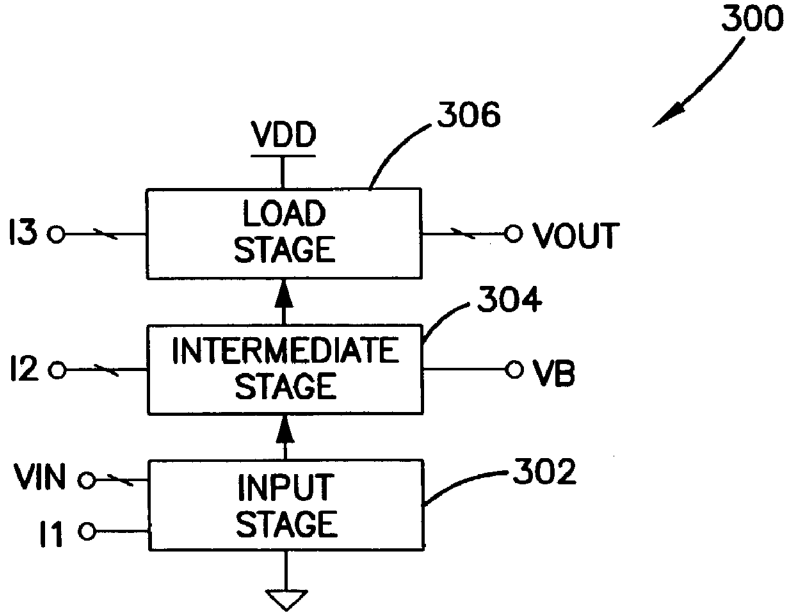
FIG. 3 is a schematic diagram illustrating a multistage analog circuit in accordance with the principles of the present invention.
Figure 4:
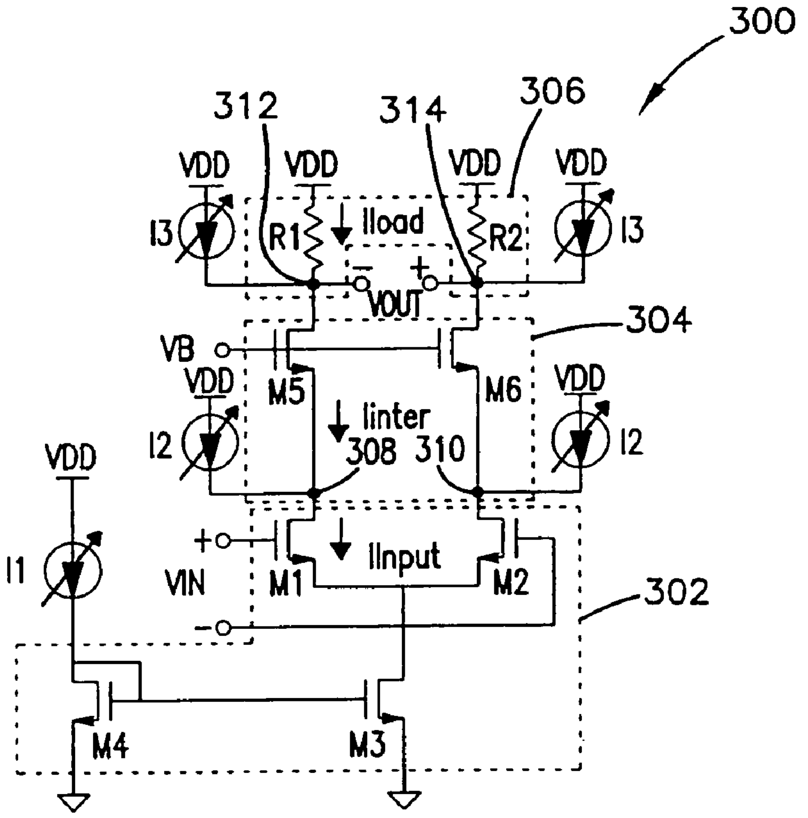
FIG. 4 is a schematic diagram illustrating an exemplary implementation of the multistage analog circuit shown in FIG. 3.

In FIG. 3, a multistage analog circuit 300 in accordance with the principles of the present invention, includes an input stage 302, an intermediate stage 304, and an output load stage 306, arranged in cascodes, i.e. one on top of another, between a voltage supply VDD and ground. The input stage 302 is connected to a signal input port VIN and a first current source I1. The intermediate stage 304 is connected to a bias voltage supply VB and a second current source I2. The bias voltage supply VB provides a constant bias voltage for transistors M5–M6 as shown in FIG. 4. The output load stage 306 is connected to a signal output port VOUT and a third current source I3.

The current sources I1, I2, and I3 can be arbitrarily set, and if desired, the current sources I1, I2, and I3 can track the changes in one or two of the other current sources to control a bias current in each stage of the multistage analog circuit 300.

An exemplary implementation of the multistage analog circuit 300 is illustrated in FIG. 4 in details. The input stage 302 of the circuit 300 includes a differential pair of transistors M1–M2 and current mirror transistors M3–M4. The gate of the transistors M1–M2 are coupled to the input port VIN. The source of the transistors M1–M2 are coupled to the drain of the transistor M3. The drain of the transistors M1–M2 are coupled to cascoded transistors M5–M6 in the intermediate stage 304, respectively. The gate of the transistor M3 is coupled to the gate of the transistor M4 which is also connected to the drain of the transistor M4. The source of the transistors M3–M4 are coupled to the ground. The first current source I1 flows into the drain and the gate of the transistors M3 and M4.

The intermediate stage 304 of the circuit 300 includes transistors M5, M6. The transistors M5, M6 provides circuit isolation and signal coupling between the input stage 302 and the output load stage 306. The gate of the transistors M5, M6 are biased by the bias voltage supply VB. The source of the transistors M5, M6 are coupled to the drain of the transistors M1, M2 at nodes 308, 310, respectively. The drain of the transistors M5, M6 are coupled to cascoded resistors R1–R2 in the output load stage 306, respectively. The second current source I2 flows into the nodes 308, 310.

The output load stage 306 of the circuit 300 includes the resistors R1, R2. The resistors R1, R2 are coupled between the voltage supply VDD and the drain of the transistors M5,M6 at nodes 312, 314, respectively. The nodes 312, 314 are connected to the output port VOUT of the circuit 300. The third current source I3 flows into the nodes 312, 314.

As also shown in FIG. 4, the input stage 302 has a bias current Iinput, the intermediate stage 304 has a bias current Iinter, and the output load stage 306 has a bias current Iload. The bias currents Iinput, Iinter, and Iload can be set arbitrarily by the current sources I1, I2, and I3. The relationship of the bias currents Iinput, Iinter, and Iload is as follows:

$$I\text{input}=I1/2$$

$$I\text{inter}=I3+I\text{load}=I1/2-I2$$

$$I\text{load}=I1/2-I2-I3$$

Accordingly, given an input stage current, i.e. the first current source I1, the bias current Iinter can be set arbitrarily by using I2. If desired, I2 can track changes in I1 so that the bias current at the intermediate stage Iinter remains constant. Similarly, given the first and second current sources I1 and I2, Iload can be set arbitrarily by using I3. If desired, I3 can track changes in Iinter and Iinput so that the bias current at the output stage Iload remains constant. Accordingly, an output common mode voltage VOCM, which is determined by Iload, R1, and R2, can remain unchanged when an input stage transconductance GM is changed by the first current source I1.

Also, the second current source I2 can be used to independently control the bias current linter at the intermediate stage to meet the minimum drain-source voltage across the transistors M5 and M6 so as to control the bias operation point of the transistors M5 and M6. This is particularly important for a low voltage operation where voltage headrooms (i.e. operational voltage margins for ensuring a transistor to stay in saturation) need to be tightly controlled.

The exemplary implementation shown in FIG. 4 is a differential amplifier. It is appreciated that the present invention can be applied to other types of multistage analog circuits, for example, an integrated mixer or buffer, without departing from the principles of the present invention.

Also, the transistors M1–M6 in FIG. 4 are MOSFET transistors. It is appreciated that other types of transistors, such as bi-polar transistors, can be used without departing from the principles of the present invention.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method comprising:

independently controlling a plurality of variable bias currents, each variable bias current corresponding to one of a plurality of stages of a multistage analog circuit; and independently controlling an output voltage level and an input transconductance of the multistage analog circuit with the variable bias currents by changing at least one of the variable bias currents such that the output voltage level remains constant while the input transconductance is changed.

2. The method of claim 1 further comprising supplying the bias currents with a plurality of variable and independent current sources.

3. A method comprising:

independently controlling a plurality of variable bias currents with a plurality of variable and independent current sources, each variable bias current corresponding to one of a plurality of stages of a multistage analog circuit;

changing one of the variable and independent current sources to change an input transconductance of the multistage analog circuit; and changing at least one of the other variable and independent current sources to maintain an output voltage of the multistage analog circuit at a constant level while changing the input transconductance.

* * * * *

UNITED STATES PATENT AND TRADEMARK OFFICE

CERTIFICATE OF CORRECTION

PATENT NO. : 7,081,775 B2
APPLICATION NO. : 10/379132
DATED : July 25, 2006
INVENTOR(S) : Nilson et al.

It is certified that error appears in the above-identified patent and that said Letters Patent is hereby corrected as shown below:

In column 4, at line 56, delete “linter” and insert --Iinter--.

Signed and Sealed this

Sixth Day of November, 2007

JON W. DUDAS
*Director of the United States Patent and Trademark Office*